United States Patent [19]

Levine

[11] Patent Number: 4,622,580

[45] Date of Patent: Nov. 11, 1986

[54] SOLID-STATE IMAGER CHIP MOUNTING

[75] Inventor: Peter A. Levine, Trenton, N.J.

[73] Assignee: RCA Corporation, Princeton, N.J.

[21] Appl. No.: 654,556

[22] Filed: Sep. 26, 1984

[51] Int. Cl.$^4$ ............................ H04N 9/09; H04N 9/04
[52] U.S. Cl. ........................................ 358/50; 358/55;
358/41; 358/51; 357/24
[58] Field of Search ................. 358/41, 43, 44, 50,
358/52, 55, 209, 213, 51; 357/24 LR, 30, 74

[56] References Cited

U.S. PATENT DOCUMENTS

| | | | |
|---|---|---|---|
| 4,044,374 | 8/1977 | Roberts et al. | 357/80 |
| 4,166,280 | 8/1979 | Poole | 358/51 |
| 4,266,334 | 5/1981 | Edwards | 29/583 |
| 4,268,119 | 5/1981 | Hartmann | 350/173 |
| 4,323,918 | 4/1982 | Bendell | 358/50 |
| 4,418,284 | 11/1983 | Ogawa et al. | 250/578 |

Primary Examiner—James J. Groody
Assistant Examiner—John K. Peng
Attorney, Agent, or Firm—Eugene M. Whitacre; Peter M. Emanuel; Lawrence C. Edelman

[57] ABSTRACT

Conventionally, solid-state imager chips are packaged in ceramic IC packages. In accordance with the invention, unpackaged imager chips are bonded to a light transmissive carrier having an area substantially larger than the area of the imager chip. The light transmissive carrier both firmly supports the imager chip and includes a metallization pattern which contacts the imager chip and provides for its electrical connections to external drive and signal processing circuitry. In a preferred embodiment, the photosensitive side of a thinned-substrate solid-state imager chip is directly bonded to the exit port of a prism. The prism exit port has the metallization pattern formed thereon and includes edge connectors at its periphery for connecting to the external circuitry.

15 Claims, 10 Drawing Figures

SOLID-STATE IMAGER CHIP MOUNTING

BACKGROUND OF THE INVENTION

The present invention relates to the mounting of solid-state imager chips in an optical assembly and preferably to the mounting of solid-state imager chips having a thinned semiconductor substrate.

In general, a plurality of individual solid-state imagers, such as charge-coupled devices (CCD's), are fabricated by the selective doping in and the depositing of an electrode structure on what is conventionally called the gate side of a relatively thick (e.g. approximately 12–15 mils) semiconductor wafer. The wafer is then cut-up by a process called "dicing" for separating the individual imagers into imager chips. The electronic devices formed in the imager chips by these conventional techniques create photosensitive picture elements (pixels) which develop charges in potential wells in the semiconductor substrate beneath the electrode structure which are representative of radiant energy, such as visible light, directed at the pixels when a scene is optically imaged thereon. The charges are subsequently read-out of the pixels for developing electrical signals representative of the scene. With such imager chips, radiant energy is directed at the pixels from the gate side of the imager chip and must therefore pass through the chips electrode structure (i.e., some energy passes through the spaces between electrodes and some energy actually passes through the electrodes). Although the electrodes are thin enough to pass some visible light, the imager's responsivity to shorter wavelengths of visible light is reduced when the light passes through the electrodes, especially its responsivity to blue light. Additionally, the electrode structure blocks some light, reducing sensitivity.

In order to improve imager responsivity and sensitivity, imagers have been developed wherein the side of the semiconductor substrate opposite the gate side is thinned, e.g., by chemical etching, to about 8–10 micrometers. FIG. 1a illustrates an imager chip 10 having a thinned semiconductor substrate. With a thinned substrate imager, radiant energy can be directed at the pixels from the thinned substrate side. The radiant energy develops electrons which are collected in the substrate's potential wells formed beneath the electrode structure. Since the radiant energy does not have to pass through and/or around an electrode structure, a thinned substrate imager is more responsive to visible light than the previously described thick substrate imager. For providing structural integrity to the thinned substrate imager, a relatively thick piece of glass (e.g., 10–20 mils) is uniformly bonded to the thinned substrate using an optical quality adhesive for forming a laminated structure. Details of a method for the manufacture of such thinned substrate imager chips is disclosed in U.S. Pat. No. 4,266,334 issued May 12, 1981 to Edwards and Pennypacker and assigned, like the present application, to RCA Corporation.

The conventional packaging of such thinned substrate imagers and the mounting of such packages to, e.g., a light splitting prism 100 (of a color video camera, not shown) is illustrated by the section and top views of an IC (integrated circuit) package 110 shown in FIGS. 1b and 1c, respectively. Package 110 includes an electrically insulating ceramic chip carrier 112 having an opening 114 and an interior shoulder portion 116 aligned with opening 114. Shoulder portion 116 supports thinned-substrate imager chip 10 such that light entering opening 114 falls on the thinned substrate side of imager chip 10. The glass laminate 120 of imager chip 10 is epoxied at its periphery to shoulder 116 so as to not interfere with the passage of light to chip 10. A glass window 122 is epoxied at its periphery to the carrier portion opposite shoulder 116, for protecting imager 10 from dirt and other contaminants while allowing light passage to imager chip 10. Electrical connection of external drive and signal processing circuitry (not shown) to imager chip 10 is made by bonding wires 124 from the gate side of imager chip 10 to a metallization pattern (not shown) formed in carrier 112, which in turn is connected to connector pins 126. The drive and signal processing circuitry are connected by conventional printed circuit board techniques to pins 126. An opaque lid 128 completes IC package 110 and is expoxied to the side of carrier 112 which is opposite window 122, for hermetically sealing and preventing extraneous light from entering IC package 110.

The positioning and mounting of IC package 110 to prism 100 may be in accordance with the teachings in U.S. Pat. No. 4,268,119 issued to Hartmann on May 19, 1981, which teaches the use of a rectangular gasket 130 having a generally rectangular opening therethrough approximately the size and shape of window 122. Preferably, gasket 130 is formed of a flexible, foamed body of material such as foam rubber and dimensioned to be in surrounding contact with window 122 of IC package 110 and in contact with an exit port 132 of prism 100. Next, mechanical micromanipulators (not shown) grasp IC package 110 and its position is precisely located in X, Y and Z planes, such that the imaging plane of imager chip 10 is e.g., the proper distance from, paralleled to and centered with respect to the optical access of exit port 132. It should be noted that the parallelness of the plane of the imaging area of the chip with the plane of the window 122 may be adversely affected by uneven application of adhesive when attaching the imager chip within package 110. Additionally, imager chip 10 must be without rotation relative to other detectors (not shown) mounted at other exit faces (not shown) of prism 100 such that the raster of imager representative signals supplied from the imager chip 10 is in registry with the image representative signals supplied from the other imagers when viewed on a monitor.

Once IC package 110 has been correctly positioned with respect to exit port 132, an adhesive or hardening cement, such as epoxy is applied around gasket 130 or injected thereinto so as to impregnate gasket 130 while IC package 110 is held in position. Thus, after the epoxy hardens it forms a rigid body which provides a secure bond between package 110 and prism exit port 132.

It should be noted that imager chip 10 is supported in IC package 110 in a manner such that its position is not precisely the same from IC package to IC package. That is, since shoulder portion 116 of carrier 112 is larger than imager chip 10, the position of chip 10 within shoulder 116 is not precisely determined and can vary during manufacture. Additionally, the parallelness of the imaging plane of imager chip 10 to window 122 can vary during manfacture due to uneven application of adhesive about the peripheries of either one or both of window 122 and imager chip 10. Thus, the above described positioning and mounting procedure must be performed for each IC package to be mounted to an optical assembly, such as the exit ports of prism 100.

FIG. 2 illustrates a package 210 for an imager chip 200 having a relatively thick semiconductor substrate 202. Package 210 includes a carrier 212, pins 226 and bonding wires 224 similar to package 110 of FIG. 1b, except that since imager chip 200 is illuminated from its gate side (because semiconductor substrate 202 is too thick to pass light), carrier 212 does not require an opening in its recessed portion 216. Thus, substrate 202 of imager 200 is epoxied in recess 216 of carrier 212 and a glass window 222 is epoxied about its periphery to carrier 212 for hermetically sealing the package while allowing light to pass through to the pixels formed on the gate side of imager chip 200. Package 210 may be mounted to prism 100 in substantially the same manner as the previously described mounting for IC package 110, such that window 222 is positioned to face the exit port of prism 100.

It is herein recognized that IC packages such as described above for solid-state imager chips are undesirable for a variety of reasons. Firstly, as previously noted, the imager chip may not be located in its IC package in a precise location during manufacture, resulting in chip location variations from IC package to IC package. Thus, rather cumbersome mounting techniques, such as the use of a resilient foam gasket are required for taking these imprecise chip locations into account when mounting an IC package, such that its imaging area is parallel and precisely located with respect to e.g., an exit port of a prism. Secondly, although the glass window protects the photosensitive surface of the imager chip from dirt, etc. from outside sources, particles such as flakes of adhesive and the like can come loose inside the package over a period of time and fall onto the photosensitive surface of the imager, causing imaging defects. Thirdly, the recessing of the imager can cause vignetting (a gradual shading at the image edges so as to leave no defined line at the border) of the image, especially in package 110, due to opening 114. Fourthly, the gap between the imager and the glass window of the package creates a space where condensation can form and degrade the image. Additionally, there are structural integrity and thermal stability problems associated with package 110 since, imager 10 is only supported by epoxy around its periphery. Finally, and perhaps more importantly, as manufacturing techniques improve and imager yields increase, the cost of the imager chip decreases to the point where the cost of the imager chip package becomes a significant part of the expense of a packaged imager. Therefore, it is herein recognized that it is desirable to eliminate the above-noted disadvantages of solid-state imager packages.

SUMMARY OF THE INVENTION

In accordance with the present invention, the photosensitive side of a solid-state imager chip is directly attached to a planer surface of a light transmissive element. The light transmissive element has an area substantially larger than the area of the imager chip. Preferably, the element is an optical processing component, such as a light-splitting prism, of a camera for which the imager chip is intended. The element includes a metallization pattern extending from its periphery to an area where the imager chip is attached for providing electrical connection to the imager chip. Coupling means, such as edge connectors are coupled to the metallization pattern near the periphery of the element for electrically connecting the imager chip to external imager drive and signal processing circuitry. Thus, the use of a separate package and all its disadvantages are avoided.

DETAILED DESCRIPTION OF THE INVENTION

Figure 1A:
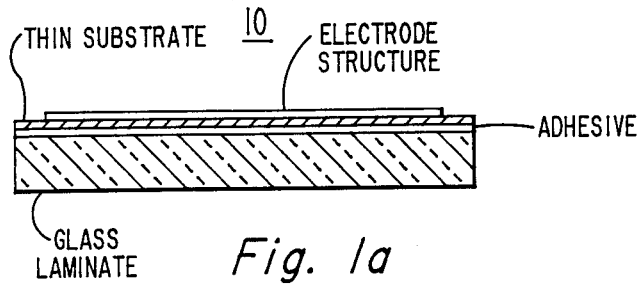
FIGS. 1a, 1b and 1c, previously described, illustrate a thinned-substrate solid-state imager chip and its packaging and mounting to a prism according to the prior art.
Figure 1B:
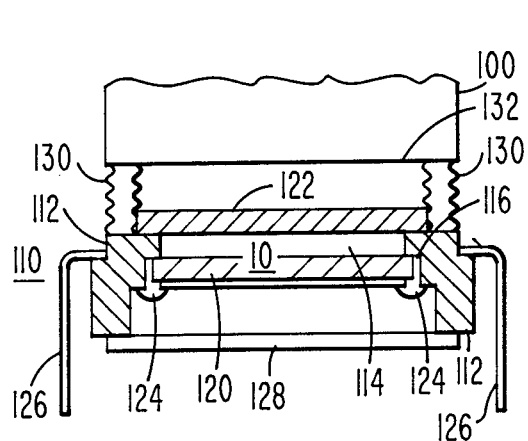
Figure 1C:
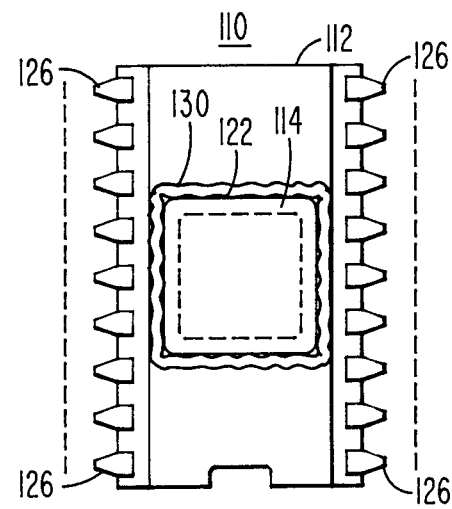
Figure 3A:
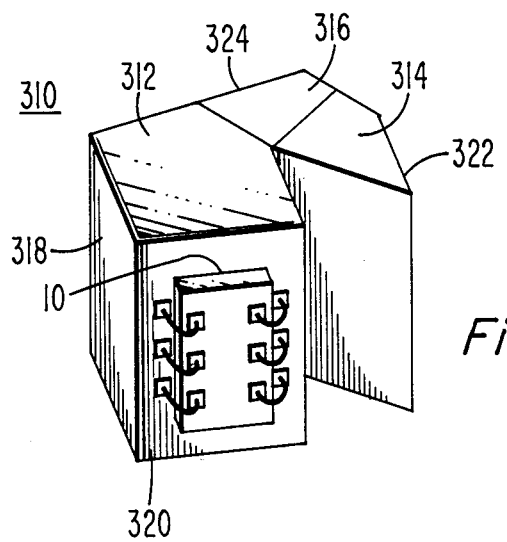
FIGS. 3a, 3b and 3c illustrate the mounting of a thinned-substrate solid-state imager chip to a color light-splitting prism in accordance with an aspect of the invention.
Figure 3B:
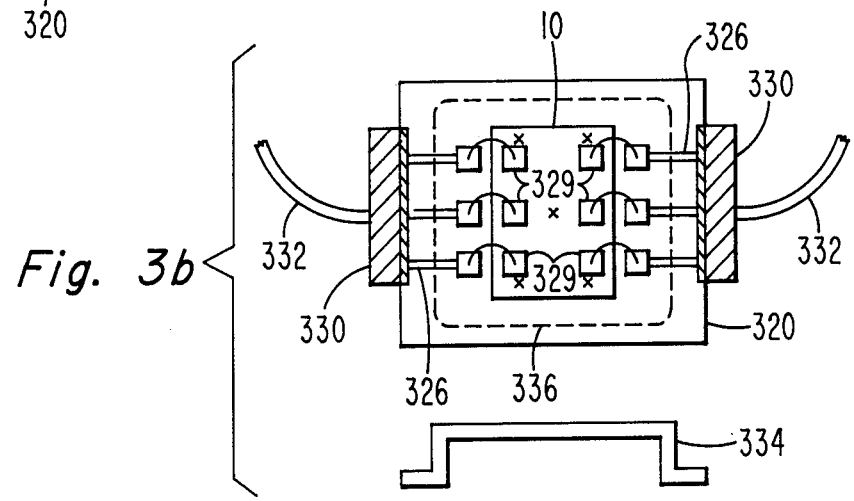
Figure 3C:
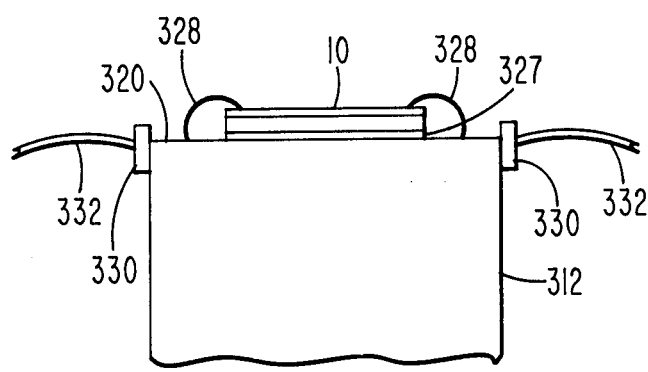

FIGS. 3a, 3b, and 3c illustrate an integral imager chip/prism assembly in accordance with a first aspect of the invention. In FIG. 3a, a color light-splitting prism designated generally as 310, is formed from three optically transmissive prism sections 312, 314, and 316, separated by dichroic surfaces, as known in the art, for dividing light directed at an input port 318 into its red, green and blue components at exit ports 320, 322, and 324, respectively. In accordance with an aspect of the invention, the glass laminate side of a thinned-substrate solid-state imager chip 10 of the type shown in FIG. 1a is directly attached to prism 310 in a fixed position at each of its exit ports 320, 322 and 324 for providing red, green and blue color component signals representative of the light from a scene directed at input port 318. The mounting of imager chip 10 to red exit port 320 is shown in detail in FIGS. 3b and 3c. The mounting of imager chips to exit ports 322 and 324 is not shown, but is substantially the same as the mounting of imager chip 10 to exit port 318. The direct mounting of the imager chip to the prism exit port according to the invention is advantageous over the prior art mounting of IC packages since there is no air space in front of the chip's photosensitive surface for dirt or flakes of adhesive to fall, nor condensation to form, which degrades the performance of the imager. Furthermore, there is little possibility of the photosensitive surface of the imager chip not being substantially parallel to the image plane of the prism, since the chip itself is directly attached to the prism exit port. Also, the imager chip can be more securely attached to the prism (as will next be described), improving its structural integrity and thermal stability, both of which are important requirements for imagers used in e.g., a portable video camera. Finally, there is no possibility of vignetting of the image since there is no window such as found in package 110 of FIG. 1b.

As shown in FIGS. 3b and 3c, prism exit port 320 includes a metallized pattern of conductors 326 extending from the periphery of prism exit port 320 towards the area where imager chip 10 is to be bonded. During manufacture of the integral imager chip/prism assembly, an optical quality adhesive is uniformly applied to the glass laminate of imager 10 (referred to with respect to FIG. 1a) which is then positioned on the surface of exit port 320 such that the center of the photoconductive area of the imager chip is aligned with the optical axis of exit port 320. In the prior art, positioning of packaged imager chips is accomplished by activating the imager and viewing on a monitor a raster formed by the image signals supplied from the imager during readout. However, with the present imager chip mounting arrangement, positioning of a thinned-substrate imager chip can be accomplished optically using alignment marks, such as metallized pads, deposited over the electrode structure on the gate side of the imager. The location of the alignment marks are indicated by X's in FIG. 3b. The alignment marks do not interfere with the electrical operation of the imager because there is an oxide layer that electrically insulates the alignment marks from the electrode structure, nor do they interfere optically because they are not on the photosensitive side of the chip. However, when the imager chip is brightly illuminated from the gate side (of course, any opaque covering over the gate side of the chip must be removed), the light passes through the chip and the alignment marks are visible on the input port 318 of the prism. During assembly, an optical quality ultraviolet light (UV) curable adhesive 327 can be uniformly spread (e.g., by the application of pressure) between the glass of the prism and the imager chip glass laminate, so that the imager chip is substantially parallel with the prism exit port and can be moved until it is aligned with the prism's optical axis. Then, the adhesive is exposed to UV light for curing it and therefore fixing the relative position between the photosensitive area of the imager chip and the prism exit port. One type of UV curable optical quality adhesive is NOA-60, available from Norland Products Inc., North Brunswick, N.J. Next, bonding wires 328 are bonded between conductor pads 329 on the gate side of the imager chip and conductors 326, for providing electrical connection to the chip. Conventional external imager drive pulse and video signal processing circuitry (not shown) are coupled to conductors 326 by a mating element, e.g., the "male" mating element, of connectors 330, which are bonded to the edge of prism exit port 320. Specifically, connectors 330 include pins (not shown) which at one end are soldered to conductors 326 and which at the other end are connected to electrical cables 332 leading to the external circuitry. A cap 334 may be bonded to exit port 320 at the area shown by dashed lines 336, for hermetically sealing the imager and protecting it from contamination from outside sources.

The assembly of imagers to the green and blue exit ports 322 and 324 is substantially the same as indicated above, except that before the adhesive is UV cured they are brightly illuminated from the gate side in order to position each imager, by viewing its alignment marks from the prism input port, into precise registration with the alignment marks visible at the input port when the previously mounted imagers are simultaneously illuminated. Once they are precisely registered, the adhesive is exposed to UV light to fix the imager chip's relative position.

Another advantage of imager chip mounting according to the invention is that chip positioning can be accomplished without activating the photosensitive devices on the imager. Thus, imager registration is optically perfect. This may not be possible with prior art prism assemblies having imager IC packages aligned by electrical registration of the image representative signals supplied from the individual imager chips (optical registration being impractical due to opaque lid 128), since when the imagers are electrically aligned their photosensitive locations are partially dependent on the amplitude of the applied electrode driving pulses. Thus, when the imager chips are electronically registered on a prism, their registration is dependent upon the level of the imager operating signals applied during manufacture, which may be different from and require re-adjustment of the signal levels found in the assembled video camera. Additionally, if after manufacture an imager failed in a video camera including a prism having imager chips mounted and aligned in accordance with the present invention, the imager chip/prism assembly can be replaced with another imager chip/prism assembly having the same registration. Consequently, readjustment of the amplitude of the imager driving pulses would not be required. Furthermore, electronic registration is rather complicated and requires a skilled operator, while optical registration can be more easily performed by automatic equipment, reducing manufacturing costs.

Figure 4:
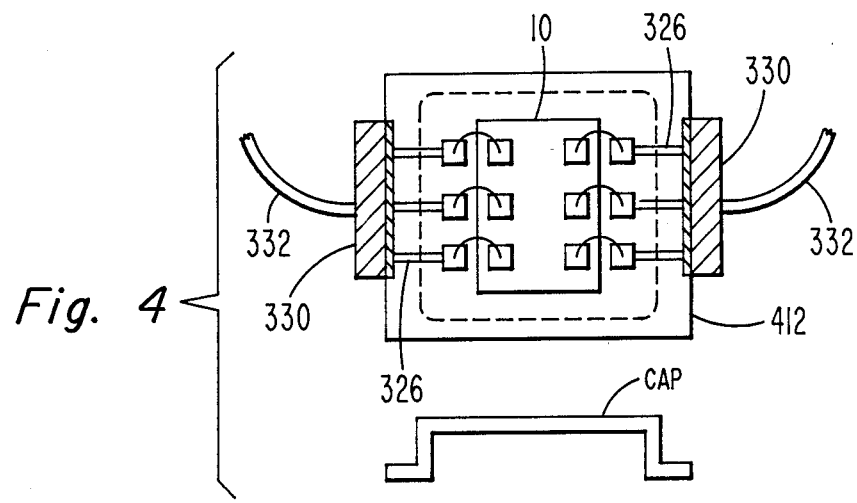
FIG. 4 illustrates the mounting of a thinned substrate solid-state imager chip to a light transmissive element in accordance with another aspect of the invention.

If, for example, it is impractical to place metallized conductors on the exit port of a prism (because e.g., the exit port is too small to support both the imager chip and the conductors 326), the advantages of the invention can still be obtained by mounting the thinned-substrate solid-state imager on a light transmissive carrier such as shown in FIG. 4. In FIG. 4, structure similar in function to that described previously with reference to FIGS. 3b and 3c is similarly numbered and will not be discussed. In FIG. 4, the prism exit port of FIGS. 3b and 3c is replaced by a relatively thick but light transmissive element or carrier 412, having an area substantially larger than the area of imager chip 10, so as to be able to support chip 10, metallized conductors 326 and edge connectors 330. Carrier 412 can comprise an optical quality glass plate. Imager chip 10 is mounted on carrier 412 using a UV curable optical quality adhesive, as shown in FIG. 4. Carrier 412 can then be mounted on a prism exit port which is too small to support the imager chip, metallized conductors and edge connectors. Again, a UV curable optical quality adhesive can be uniformly spread between carrier 412 and the prism exit port and, once carrier 412 is positioned, can be exposed to UV light to cure the adhesive for holding the imager chip in a fixed position. Furthermore, carrier 412 could be used for applications where a single imager is used, such as a single imager camera. In this application carrier 412 including chip 10 could be mounted on a printed circuit board. Wave soldering techniques could provide the electrical connections between the circuit board and metallized conductors 326.

Figure 2:
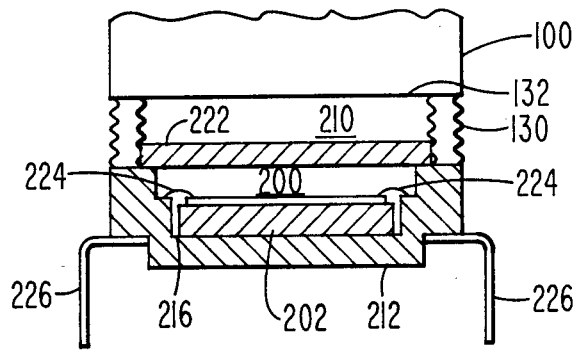
FIG. 2, previously described, illustrates the prior art packaging and mounting to a prism of a solid-state imager chip having a relatively thick substrate.
Figure 5:
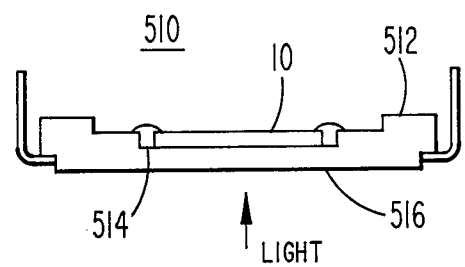
FIG. 5 illustrates an alternative embodiment of a light transmissive element for a thinned-substrate solid-state imager chip mounted in accordance with the invention.

FIG. 5 illustrates an alternative embodiment of FIG. 4 wherein the light transmissive carrier 412 of FIG. 4 is molded to take a shape substantially similar to that of carrier 212 of FIG. 2. Thus, IC package 510 includes a light transmissive carrier 512 wherein the glass laminate portion of imager 10 is directly attached, using an optical quality adhesive, to the bottom of a recess 514. Thus, the image plane of imager 10 is structurally and thermally stable and substantially parallel with the light entry portion 516 of package 510. Package 510 can then be attached to a prism exit port in substantially the same manner as imager chip 10 is attached to prism 310 as described with respect to FIG. 3a. An advantage of this type of package is that retooling of existing handling and bonding imager packaging machinery is minimized.

Figure 6:
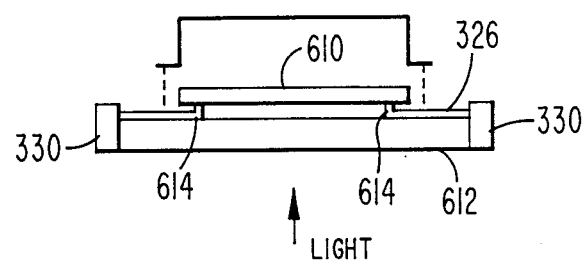
FIG. 6 illustrates a mounting arrangement for a thick substrate solid-state imager in accordance with a still further aspect of the invention.

Other embodiments of the invention will be obvious to those skilled in the art. For example, although the invention is preferably used in conjunction with a thinned substrate solid-state imager chip, a solid-state imager chip 610, as shown in FIG. 6, having a relatively thick substrate can be mounted on a light transmissive carrier 612 in substantially the same manner as the mounting of thinned substrate imager chip 10, shown in FIG. 4. The only difference is that since light is directed at the imager chip from the gate side, the electrode structure of imager chip 610 must face carrier 612. Thus, connection of the chip electrodes to conductors 326 is made by physical contact (e.g., by pressure) of the bonding pads of imager chip 610 to raised portions 614 of conductors 326. Additionally, it should be noted that although the imager chips are preferably bonded to either the prism exit port or a light transmissive carrier using an optical quality adhesive spread uniformly over the photosensitive surface of the imager chip, a non-optical quality adhesive could be used, but it would have to be applied only to the peripheries of the imager chip. Alternatively, no adhesive could be used and instead the imager chip could be mechanically clamped to the exit port of the prism. Similarly, it should be obvious to those skilled in the art that any of light transmissive carriers 412, 512, 612 or prism exit port 320, could also include thereon a color filter pattern for forming a color imager.

What is claimed is:

1. A solid-state imager assembly comprising:
   a solid-state imager chip including a substrate having selective doping and an electrode structure on a side thereof for developing an imaging area on one side of said imager chip;
   a solid element comprising a radiant energy transmissive material, said element having an area greater than the area of said imager chip and a metallization pattern deposited on one side thereof extending from the periphery of said element towards a central planer surface area of said one side of said element, said side of said imager chip including said imaging area being attached in a facing relation to said central planer surface area of said element so as to allow imaging of radiant energy which is transmitted through said central planer surface of said element onto said imaging area of said imager chip; and
   means for electrically connecting the electrode structure of said chip to said metallization pattern.

2. The assembly of claim 1 wherein said radiant energy transmissive element comprises an optical processing component of an imaging system.

3. The assembly of claim 1 wherein said imaging area side of said imager chip is adhesively attached to said radiant energy transmissive element using a radiant energy transmissive adhesive uniformly distributed between said imaging area side of said imager chip and central planar surface area of said element.

4. The assembly of claim 3 wherein said imager chip includes a thinned substrate, such that said imaging area side of said imager chip comprises said substrate side opposite said electrode structure, and a piece of light transmissive material having an area substantially the same as the area of said substrate, said material being adhesively attached to said thinned substrate on said side opposite said electrode structure using a light transmissive adhesive uniformly distributed between said substrate and said material.

5. The assembly of claim 4 wherein said light transmissive material of said imager chip is adhesively attached to said planer surface of said element using a light transmissive adhesive uniformly distributed between said material and said element.

6. The assembly of claim 5 wherein said radiant energy transmissive element comprises an optical quality clear glass plate.

7. The assembly of claim 5 further including bonding pads formed on the electrode structure side of said imager chip and wires bonded between said bonding pads and said metallized pattern on said element.

8. The assembly of claim 7 wherein said radiant energy transmissive element comprises the exit port of a light splitting prism.

9. The assembly of claim 7 further including a light splitting prism, the surface of said element opposite said surface attached to said imager chip being adhesively attached to an exit port of said prism using a light transmissive adhesive uniformly distributed between said element and said exit port.

10. The assembly of claim 1 wherein said imager chip includes a relatively thick substrate, bonding pads formed on the electrode structure side of said chip and the photosensitive electrode structure side of said chip is adhesively attached to said element such that the bonding pads of said chip make electrical contact with the metallization pattern on said element.

11. An integral imager/prism assembly comprising:
    a light-splitting prism having a light input port and a plurality of light exit ports, each exit port including a planer surface having a central area for transmitting light directed at said input port and including a metallized conductor pattern deposited thereon and extending from the periphery of said exit port towards said central area;
    a plurality of solid-state imager chips, each chip having a substrate including selective doping and an electrode structure on one side thereof for defining photosensitive devices, wherein each one of said solid-state imager chips is adhesively attached to the central area of a respective one of said exit ports of said prism; and
    coupling means for electrically connecting the electrode structure of each one of said solid-state imager chips to the metallized conductor pattern deposited on the surface of the respective one of said prism exit ports.

12. The assembly of claim 11 wherein each of said imager chips includes a thinned substrate attached to a piece of glass, said glass having an area substantially the same as said substrate and being attached to said substrate by an optically transmissive adhesive uniformly distributed between said glass and said substrate.

13. The assembly of claim 12 wherein the side of said glass opposite the side attached to said chip is adhesively attached to the central area of each of said prism exit ports.

14. The assembly of claim 13 wherein the electrode structure of each chip includes bonding pads and wherein said coupling means comprises wires bonded between said bonding pads of each chip and said metallized pattern on each one of respective prism exit ports.

15. The assembly of claim 12 wherein said coupling means further includes edge connectors attached to the periphery of respective ones of said prism exit ports for coupling external imager drive and signal processing circuitry to said imager chips.

* * * * *